United States Patent [19]

Smith

[11] 4,142,604

[45] Mar. 6, 1979

[54] SPEAKER STRUCTURE

[76] Inventor: Todd G. Smith, 1200 Mariposa Ave., Coral Gables, Fla. 33146

[21] Appl. No.: 723,577

[22] Filed: Sep. 15, 1976

[51] Int. Cl.[2] .......................... H05K 5/00; A47B 81/06

[52] U.S. Cl. ...................................... 181/156; 181/154; 181/199

[58] Field of Search ............... 181/156, 150, 154, 148, 181/151, 199, 144, 145, 147; 179/1 E

[56] References Cited

U.S. PATENT DOCUMENTS

| | | | |
|---|---|---|---|
| 1,875,171 | 8/1932 | Sprague et al. | 181/156 |
| 2,036,832 | 4/1936 | Scheldorf | 181/145 |
| 2,206,012 | 7/1940 | Hart | 181/156 |
| 2,544,742 | 3/1951 | Volf | 181/145 |
| 2,792,069 | 5/1957 | Gately, Jr. | 181/145 |
| 2,890,297 | 6/1959 | Lehr | 181/148 |
| 2,915,588 | 12/1959 | Bose | 179/1 E |
| 3,578,103 | 5/1971 | Lennes | 181/156 |
| 4,006,308 | 2/1977 | Ponsgen | 181/147 |
| 4,033,430 | 7/1977 | Bolden | 181/199 |

FOREIGN PATENT DOCUMENTS

| | | | |
|---|---|---|---|
| 480769 | 12/1969 | Switzerland | 179/1 E |

OTHER PUBLICATIONS

Publication "Direct Radiator Loudspeaker Enclosures" by Harry F. Olson, Audio Engineering - Nov. 1951, p. 34, vol. 35, Issue 11.

*Primary Examiner*—Stephen J. Tomsky
*Attorney, Agent, or Firm*—Robert J. Van Der Wall

[57] ABSTRACT

A speaker structure comprising a tetrahedronal shell having an upper end and an equilateral triangular base with equisized triangular walls and with the margins of the adjacent walls and base being secured together and wherein one of the walls includes a pattern of port openings and these openings are arranged about a central opening spanned by a speaker which is fixed thereabout.

6 Claims, 4 Drawing Figures

SPEAKER STRUCTURE

FIELD OF THE INVENTION

This invention relates to a structure for speakers.

BACKGROUND OF THE INVENTION

In the past there have been numerous types of acoustical speakers. This invention is, also, of an acoustical speaker. It is an object of the invention to provide an acoustical speaker of the type which can be set on the floor and which includes a generally planar base of equilateral triangular form, as seen in plan, and with respect to which there are arranged in upstanding relation three equilateral triangular walls which meet at a apex of the structure defining a tetrahedronal structure and wherein one of the walls is provided with a main through opening for a speaker and which provides a high quality sound reproduction.

It is, generally, an object of this invention to provide a device of the type described hereinafter which is simple in construction, is inexpensive to manufacture and which is designed to rest on the floor, to occupy a minimum amount of space for a high quality sound reproduction and which is otherwise well adapted for the purposes which are set forth more fully herein and wherein the structure is generally, as set forth.

In accordance with these and other objects which have become apparent hereinafter, the instant invention will now be described with reference to the accompanying drawing, in which:

DESCRIPTION OF PREFERRED EMBODIMENT

Figure 1:
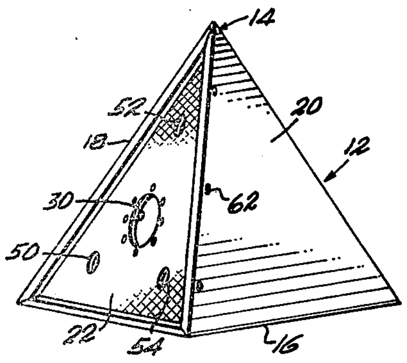
FIG. 1 is a perspective view of a speaker structure constructed in accordance with this invention.

Referring to the drawings, wherein like reference characters designate like or corresponding parts throughout the several views, there is shown a speaker structure 12 which includes an apex 14 and a base 16. The base is of equilateral, triangular form as seen in plan, and the walls are three in number, 18, 20 and 22, each being equilateral as viewed in perpendicular relation thereto. Each of the walls includes an upper vertex and the vertices are connected together at the apex 14 of the structure while the base of each wall is connected to the base of the structure along the marginal zone of the base.

An opening generally designated by the numeral 30 is provided in one of the walls, such as 22, for the purpose of accommodating a speaker 34 to be mounted therein and which may include a ring type mounting plate 36 which holds the speaker to be connected to the margin of the wall about the opening by screws which may be six, eight or nine in number, as at 39.

Additionally, three ports 50, 52 and 54 are arranged in the wall 22 about the speaker and, in the preferred embodiment, each of these is on a line from the center of the wall to the various angles and are located midway along the length thereof.

Figure 2:
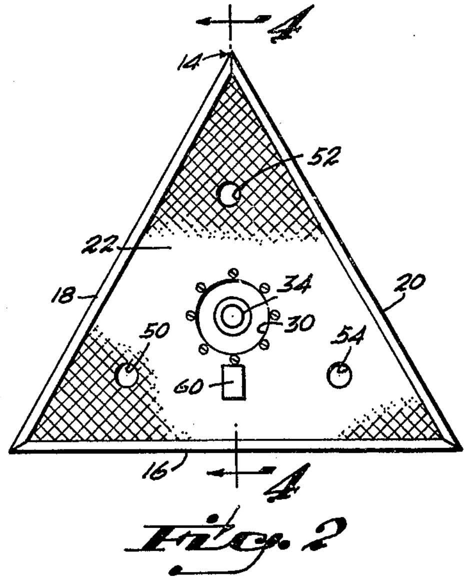
FIG. 2 is a front elevation view of the device shown in FIG. 1.
Figure 3:
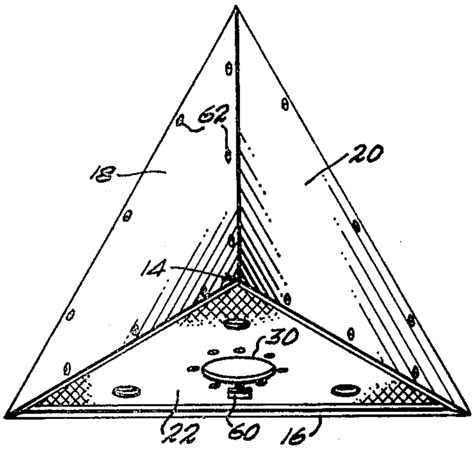
FIG. 3 is a top view of the device shown in FIG. 2.

The speaker means is preferably of the triaxial speaker type, and, as indicated generally by the crossed lines in FIG. 2, an openwork type decorative net may be provided over the surface of the wall 22. A cross-over network means 60 may be provided for the device as is indicated by the numeral 60; and it comprises a conventional electronic unit for cophasing the audio frequencies of the triaxial speaker means.

Figure 4:
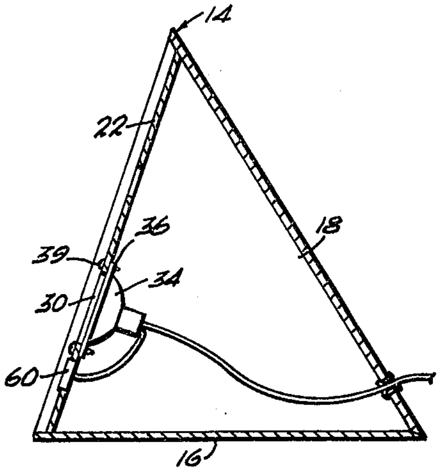
FIG. 4 is a view in cross section taken along the plane indicated by the line 4—4 of FIG. 2 and looking in the direction of the arrows.

In the preferred embodiment, the base and walls are of plywood, either one-half inch or three-quarter inch, and the pieces are joined together by glue at appropriately beveled edges as indicated in the drawings. Additionally, the panel or wall 22 is recessed slightly as indicated in FIG. 4 so as to nest within the opening and provide a strong, sturdy, rigid structure. To further reinforce the structure screws, such as 62, may be provided to join the margins of the adjacent wall and base together.

It is thus seen that there is provided a simple and inexpensive structure for a speaker which is highly efficient in transmitting sound in a faithfully reproduced form.

While the instant invention has been shown and described in a preferred embodiment, it is recognized that departures may be made within the spirit of the invention.

What is claimed is:

1. A speaker comprising:

a tetrahedronal structure having an apex;

an equilateral, triangular base;

three substantially equisized and equilateral triangular planar walls, each wall meeting adjoining walls with an included angle of substantially 120 degrees measured parallel to the base, each wall having an upper vertex meeting at the apex, each wall having a base connected to the triangular base;

a central opening in the center zone of one of the walls, said wall having three ports, each of the ports being aligned from the center of said wall toward the angles thereof and midway between; and a speaker means mounted in spanning relation to the central opening;

whereby a reflex speaker enclosure entirely comprised of only four planar surfaces is created in which there are no internal surfaces parallel or perpendicular to each other, thus minimizing diffraction effects from internally reflected and overlapping sound waves.

2. The speaker set forth in claim 1 wherein the speaker means is a triaxial speaker.

3. The speaker as set forth in claim 1 wherein a decorative open-work net material is arranged to cover said wall having the central opening.

4. The device as set forth in claim 2 wherein a cross-over network means is provided to co-phase the audio frequency of the triaxial speaker means.

5. The device as set forth in claim 1 wherein the walls and base are of plywood material.

6. The device as set forth in claim 5 wherein the walls and base are glued together.

* * * * *